(12) United States Patent
Wang

(10) Patent No.: US 6,999,746 B2
(45) Date of Patent: Feb. 14, 2006

(54) IMAGE REJECTION MIXER

(75) Inventor: Jianqin Wang, Tokyo (JP)

(73) Assignee: NEC Compound Semiconductor Devices, Ltd., (JP)

( * ) Notice: Subject to any disclaimer, the term of this patent is extended or adjusted under 35 U.S.C. 154(b) by 604 days.

(21) Appl. No.: 09/821,002

(22) Filed: Mar. 29, 2001

(65) Prior Publication Data

US 2001/0027095 A1    Oct. 4, 2001

(30) Foreign Application Priority Data

Mar. 30, 2000    (JP)    .............................. 2000-095050

(51) Int. Cl.
H04B 1/26    (2006.01)
H04B 1/28    (2006.01)
H04B 1/10    (2006.01)

(52) U.S. Cl. ...................... 455/323; 455/326; 455/333; 455/324; 455/302; 455/304

(58) Field of Classification Search ................ 455/313, 455/323, 324, 333, 326, 302, 303, 304, 305, 455/285; 327/113, 116, 119, 355–361, 254–256; 375/316

See application file for complete search history.

(56) References Cited

U.S. PATENT DOCUMENTS

| | | | |
|---|---|---|---|
| 4,677,692 A * | 6/1987 | Sakashita et al. | 455/319 |
| 4,725,767 A | 2/1988 | Mori | 323/218 |
| 5,303,417 A * | 4/1994 | Laws | 455/314 |
| 5,339,462 A * | 8/1994 | Staudinger et al. | 455/330 |
| 5,369,790 A * | 11/1994 | Yokota | 455/164.1 |
| 5,708,399 A * | 1/1998 | Fujii et al. | 332/103 |
| 6,029,059 A * | 2/2000 | Bojer | 455/326 |
| 6,073,001 A * | 6/2000 | Sokoler | 455/323 |
| 6,226,509 B1 * | 5/2001 | Mole et al. | 455/302 |
| 6,597,899 B1 * | 7/2003 | Souetinov et al. | 455/323 |
| 6,687,494 B1 * | 2/2004 | Mourant | 455/326 |

FOREIGN PATENT DOCUMENTS

| | | |
|---|---|---|
| EP | 0434203 | 6/1991 |
| EP | 0763885 | 3/1997 |
| EP | 000849873 A1 * | 11/1997 |
| EP | 0877476 | 11/1998 |
| EP | 001024590 A1 * | 8/2000 |
| JP | 62-278813 | 12/1987 |
| JP | 5-191153 | 7/1993 |
| JP | 6-204752 | 7/1994 |
| JP | 8-130416 | 5/1996 |
| JP | 10-190359 | 7/1998 |
| JP | 11-234046 | 8/1999 |
| JP | 11-261373 | 9/1999 |

* cited by examiner

*Primary Examiner*—Duc M. Nguyen
(74) *Attorney, Agent, or Firm*—Hayes Soloway P.C.

(57) ABSTRACT

An image rejection mixer of reduced power dissipation includes a signal distributor supplied with local signals having a phase difference to distribute the local signals, a first and a second signal mixer for mixing the distributed local signals and RF signals having a phase difference and outputting respective IF current signals, a phase shifter for shifting in phase the respective mixed IF current signals so as to provide them with a relative phase difference of 90 degrees, and a signal adder for adding the respective phase shifted intermediate frequency current signals. The shifter shifts the phases of the respective IF current signals outputted from the first and the second signal mixers.

10 Claims, 6 Drawing Sheets

IMAGE REJECTION MIXER

BACKGROUND OF THE INVENTION

1. Technical Field of the Invention

The present invention relates to an image rejection mixer, and a receiver using the mixer.

2. Description of the Prior Art

Conventionally, many of receivers such as radio communication devices have an image rejection mixer for removing an image signal component out of a received radio frequency signal. Hereafter, the conventional image rejection mixer will be described by referring to the drawing.

FIG. 6 is a block diagram of an image rejection mixer device described in JP 10-190359 A (1998). FIG. 7 is an equivalent circuit diagram of phase shifters of the image rejection mixer device shown in FIG. 6. The phase shifters include CR lattice circuits each having capacitors C and resistors R.

As for local oscillator signals to be applied to two mixers 101 and 102 in the image rejection mixer device shown in FIG. 6, a signal supplied from a common local oscillation source is shifted in phase by +45° and −45° by using, for example, phase shifters 103 and 104, respectively, resulting in a quadrature phase state.

Thereafter, I and Q output signals, respectively, of the mixers 101 and 102 are further shifted in phase by 90° with respect to each other by, for example, a+45° for phase shifter 105 and a−45° for phase shifter 10, respectively. Resulting I and Q output signals are added in an adder circuit 107. As a result, signal components of "requested" sidebands obtained from these two output signals reinforce each other. On the other hand, signal components of "image" sidebands cancel each other.

Furthermore, as shown in FIG. 7, emitter-coupled transistor pair 125 and 126 are supplied with I and Q channel signals having opposite phases, respectively. Current signals supplied from collector electrodes of the transistors 125 and 126 are shifted in phase by +45° and −45° by phase shifter means 127 and 128, respectively. Resultant signals are added at an output terminal 133 connected to collector electrodes of transistors 129 and 132 and an output terminal 134 connected to collector electrodes of transistors 130 and 131.

The transistors 129 and 130 are connected to paired transistors 125 in a cascode form, respectively. Furthermore, the transistors 131 and 132 are connected to paired transistors 126 in a cascode form, respectively. A bias potential is supplied to base electrodes of the transistors 129 to 132 through a common path 135. For each of the emitter-coupled transistor pair 125 and 126, only one current source 136 is required. Only two current sources in total are thus required. Therefore, the current taken out from a power supply which is not illustrated can be suppressed down to the minimum.

In the conventional technique, a CR lattice circuit is used in each phase shifter. Since the CR lattice circuit is current-driven by a constant current source, however, power dissipation becomes high. The reason will be described now. It is desired that values of capacitors C1 and C2 and resistors R1 and R2 of the CR lattice circuit are determined so as to satisfy the following equations, $$C1R1 = (1-\cos \alpha)/2\pi f \sin \alpha$$

$$C2R2 = (1+\sin \alpha)/2\pi f \cos \alpha$$

where f is the IF operation frequency. In the case where the IF operation frequency is large, it dissipation becomes high.

Furthermore, in the conventional technique, each phase shifter includes a transistor pair and a current source. The transistor pair and the current source may cause noise and distortion. If noise or the like occurs, the noise figure of the image rejection mixer becomes large and the reception sensitivity becomes worse in some cases. Reduction of noise and distortion is therefore demanded.

For making the input impedance of an adder used in the conventional technique small so as to be close to 0, it is necessary to input a greater DC current to the adder. If it is attempted to input a greater DC current, however, the power dissipation in the image rejection mixer becomes higher.

SUMMARY OF THE INVENTION

An object of the present invention is to lower the power dissipation of the image rejection mixer.

Furthermore, another object of the present invention is to provide an image rejection mixer reduced in noise and distortion.

The image rejection mixer of the present invention includes distribution means supplied with local signals having a phase difference to distribute the local signals, first and second mixing means for mixing the distributed local signals and radio frequency signals having a phase difference and outputting respective intermediate frequency current signals, phase shift means for shifting in phase the respective mixed intermediate frequency current signals so as to provide them with a relative phase difference of 90 degrees, and addition means for adding the respective phase shifted intermediate frequency current signals, characterized in that the phase shift means shifts in phase the respective intermediate frequency current signals outputted from the first and second mixing means.

The above-mentioned phase shift means includes a lattice circuit having inductors and resistors. Furthermore, the addition means includes a differential amplifier having a feedback loop of positive feedback, and adds the intermediate frequency current signals inputted. In addition, it is desirable that the image rejection mixer includes impedances between the first and second mixing means and the phase shift means, and values of the impedances are determined on the basis of a phase difference between the intermediate frequency current signal outputted from the first mixing means and the intermediate frequency current signal outputted from the second mixing means.

Furthermore, a receiver of the present invention includes the above described image rejection mixer and receiving means for receiving the respective radio frequency signals having a phase difference, and characterized in that image signals are removed by the image rejection mixer from the respective radio frequency signals received by the receiving means.

As heretofore described, an image rejection mixer of the present invention shifts in phase intermediate frequency current signals outputted from respective mixing means. As a result, the power dissipation of the image rejection mixer can be reduced.

PREFERRED EMBODIMENT OF THE INVENTION

First Embodiment

Figure 1:
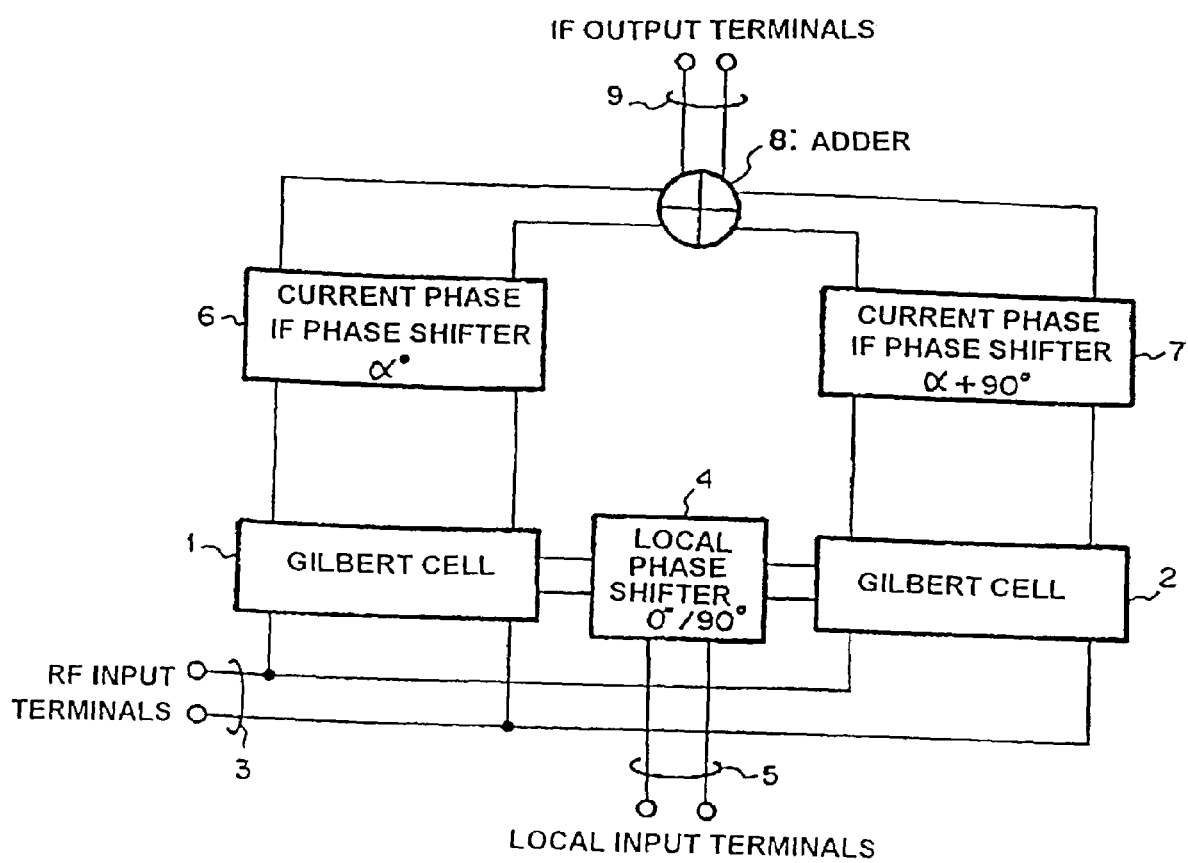
FIG. 1 is a block diagram of an image rejection mixer according to a first embodiment of the present invention.
Figure 2:
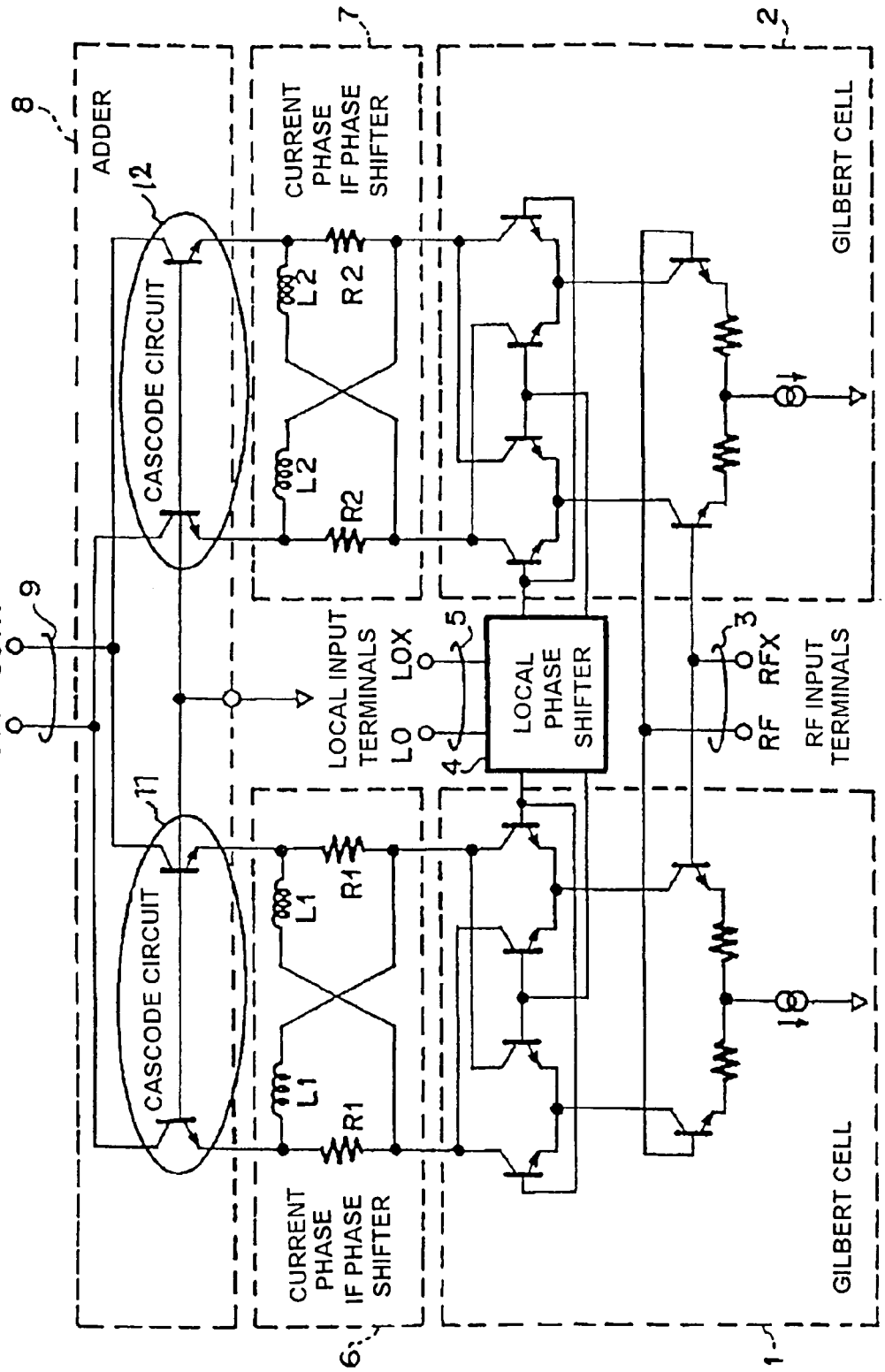
FIG. 2 is an equivalent circuit diagram of an image rejection mixer shown in FIG. 1.

FIG. 1 is a block diagram of an image rejection mixer according to a first embodiment of the present invention. FIG. 2 is an equivalent circuit diagram of the image rejection mixer shown in FIG. 1.

In FIGS. 1 and 2, there are shown local input terminals 5 for inputting local signals LO and LOX having, for example, a phase difference of 90°, a local phase shifter 4 for outputting the local signal LO and the local signal LOX with the same phase and shifting them in phase by 90° and outputting resultant signals, radio frequency (RF) input terminals 3 for inputting an RF signal and an RFX signal which have an image RF signal and have a phase difference of, for example, 90°, and double smoothing mixers such as Gilbert cells 1 and 2 for mixing the RF signal and the RFX signal with output signals of the local phase shifter 4 and outputting an IF current signal.

Furthermore, there are also shown in FIGS. 1 and 2, intermediate frequency (IF) phase shifters of current phase shift type 6 and 7 such as IF current phase shifters of LR type including lattice circuits having inductors L1 and L2 and resistors R1 and R2 to shift in phase IF current signals outputted from the Gilbert cells 1 and 2 by $\alpha$ degrees and $(\alpha+90)$ degrees and output resultant signals, an adder 8 having cascode circuits 11 and 12 to add output signals of the IF phase shifters of current phase type 6 and 7 and thereby remove an RF image signal, and IF output terminals 9 for outputting IF signals obtained by the addition in the adder 8.

To be concrete, the IF phase shifter of current phase type 6 is supplied in parallel with IF current signals fed from the Gilbert cell 1. The IF current signals fed from the Gilbert cell 1 are inputted to resistors R1 and inductors L1 in parallel. In the same way, the IF phase shifter 7 of current phase type is supplied in parallel with IF current signals fed from the Gilbert cell 2. The IF current signals fed from the Gilbert cell 2 are inputted to resistors R2 and inductors L2 in parallel.

Furthermore, the cascode circuit 11 of the adder 8 is supplied in parallel with IF current signals shifted in phase by $\alpha$ degrees outputted from the IF phase shifter of current phase shift type 6. The cascode circuit 12 is supplied in parallel with IF current signals shifted in phase by $(\alpha+90)$ degrees outputted from the IF phase shifter 7 of current phase shift type. By the way, signals having a phase difference of 90 degrees, such as signals outputted from the IF phase shifters of current phase shift type 6 and 7, are called in-phase and quadrature phase signals.

Subsequently, operation of the image rejection mixer shown in FIGS. 1 and 2 will be described. First of all, the RF signal and RFX signal inputted from the RF input terminals 3 are outputted to the Gilbert cells 1 and 2. Furthermore, the LO signal and the LOX signal inputted from the local input terminals 5 are outputted to the Gilbert cells 1 and 2 with the same phase and with a phase shifted by 90° by the local phase shifter 4.

Subsequently, in the Gilbert cells 1 and 2, the RF signal and the RFX signal having a phase difference of, for example, 90° are mixed with the local signals of the local phase shifter 4. Resultant IF current signals are outputted to the IF phase shifters of current phase shift type 6 and 7. The IF phase shifter of current phase shift type 6 shifts in phase each of the inputted IF current signals by $\alpha$ degrees by using the lattice circuit having the inductors L1 and the resistors R1 and outputs resultant signals.

On the other hand, the IF phase shifter of current phase shift type 7 shifts in phase each of the inputted IF current signals by $(\alpha+90)$ degrees by using the lattice circuit having the inductors L2 and the resistors R2 and outputs resultant signals to the adder 8. In the adder 8, output signals respectively inputted from the IF phase shifters of current phase shift type 6 and 7 are added by the cascode circuits 11 and 12. Resultant signals are outputted from the IF output terminals 9 as IF signals.

Here, the RF signals which do not contain an image RF signal have the same phase. Therefore, the RF signals which does not contain an image RF signal are amplified by the addition in the adder 8, and outputted from the IF output terminals 9. On the other hand, the image RF signals are opposite to each other in phase. Therefore, the image RF signals are removed by the addition in the adder 8, and not outputted from the IF output terminals 9. A principle of such removal of image RF signals will now be described.

Figure 3A:
FIGS. 3A to 3E are illustrations showing a principle of removal of an image signal in an image rejection mixer shown in FIGS. 1 and 2.

FIGS. 3A to 3E are explanatory diagrams of the principle of removing the image signals in the image rejection mixer shown in FIGS. 1 and 2. First of all, an IF current signal obtained by mixing the RF signal containing the image RF signal and the LO signal in the Gilbert cell 1 is denoted by an $IF_0$ current signal. An IF current signal obtained by mixing only the image RF signal and the LO signal in the Gilbert cell 1 is denoted by an $IMIF_0$ current signal. The IF current signals outputted from the Gilbert cell 1 can be represented by a vector diagram as shown in FIG. 3A.

An IF current signal obtained by mixing the RF signal containing the image RF signal and an LO90 signal having a phase difference of 90 degrees with respect to the LO signal in the Gilbert cell 2 is denoted by an IF90 current signal. An IF current signal obtained by mixing only the image RF signal and the $LO_{90}$ signal having a phase difference of 90 degrees with respect to the LO signal in the Gilbert cell 2 is denoted by an $IMIF_{90}$ current signal. The IF current signals outputted from the Gilbert cell 2 can be represented by a vector diagram as shown in FIG. 3B.

Furthermore, signals obtained by shifting in phase the $IF_0$ current signal and the $IMIF_0$ current signal shown in FIG. 3A by $\alpha$ degrees in the IF phase shifter of current phase shift type 6 are denoted by $IF_0\alpha$ current signal and $IMIF_0\alpha$ current signal. The $IF_0\alpha$ current signal and the $IMIF_0\alpha$ current signal can be represented by a vector diagram as shown in FIG. 3C.

Figure 3B:
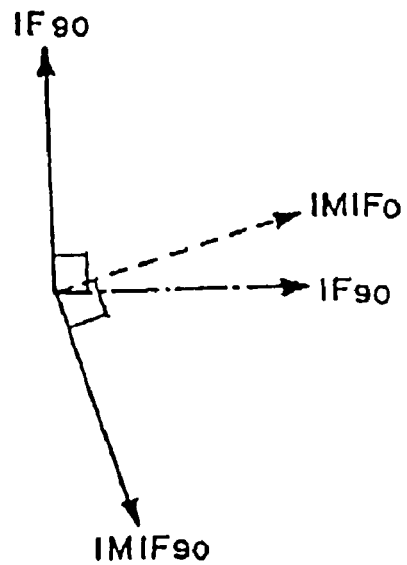

Furthermore, signals obtained by shifting in phase the $IF_{90}$ current signal and the $IMIF_{90}$ current signal shown in FIG. 3B by $(\alpha+90)$ degrees in the IF phase shifter of current phase shift type 7 are denoted by $IF\alpha_{+90}$ current signal and $IMIF\alpha_{+90}$ current signal. The $IF\alpha_{+90}$ current signal and the $IMIF\alpha_{+90}$ current signal can be represented by a vector diagram as shown in FIG. 3D.

Figure 3C:
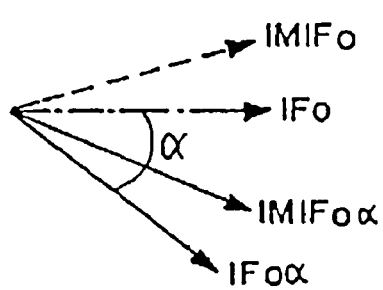
Figure 3D:
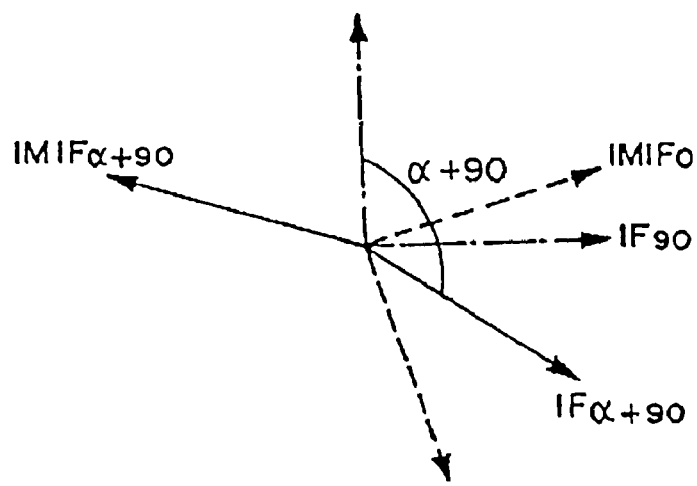
Figure 3E:
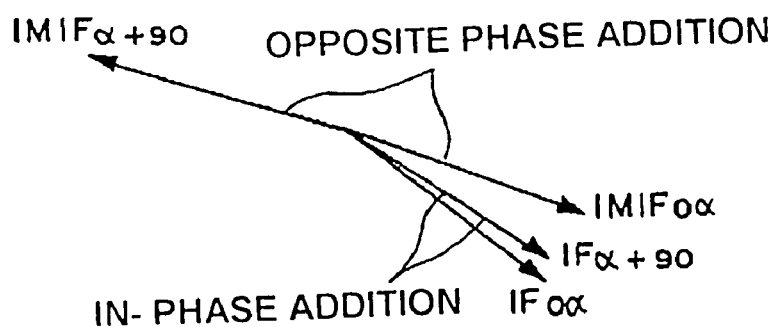

The $IF_0\alpha$ current signal and the $IMIF_0\alpha$ current signal shown in FIG. 3C and the $IF\alpha_{+90}$ current signal and the $IMIF\alpha_{+90}$ current signal shown in FIG. 3D are added in the adder 8. The addition can be represented by a vector diagram shown in FIG. 3E. Here, the $IF_0\alpha$ current signal and the $IF\alpha_{+90}$ current signal are amplified by addition, because they are the same in phase. On the other hand, the $IMIF_0\alpha$ current signal and the $IMIF\alpha_{+90}$ current signal are removed by addition, because they are the opposite to each other in phase.

In the relation between the RF signal and the LOX signal, the relation between the RFX signal and the LO signal, and the relation between the RFX signal and the LOX signal, the relation as described above holds true in the same way. Therefore, the RF signals which do not contain the image RF signals are amplified and outputted from the IF output terminals 9. The RF image signals are removed mutually and are not outputted from the IF output terminals 9.

Subsequently, the LR lattice circuits included in the IF phase shifters of current phase shift type 6 and 7 will be described. The LR lattice circuits are supplied with the current signals outputted from the Gilbert cells 1 and 2. Since the DC component of the inputted current signal flows through the inductor L, the voltage drop across the resistor R becomes 0. Power dissipation of the image rejection mixer can thus be reduced.

Furthermore, maximizing the current gain and effecting a phase shift of α degrees can be achieved by making the output impedance of the IF phase shifter of current phase type 6, i.e., the input impedance of the adder 8 equal to 0. This can be achieved by determining values of the inductor L1 and the resistor R1 of the LR lattice circuit of the IF phase shifter of current phase shift type 6 so that the inductor L1 and the resistor R1 may satisfy the following equation.

That is, the inductors L1 and L2 and the resistors R1 and R2 must satisfy $$L1/R1 = (1-\cos\alpha)/2\pi f \sin\alpha$$

$$L2/R2 = (1-\sin\alpha)/2\pi f \cos\alpha$$

where f is the IF operation frequency. In the case where the input impedance of the adder 8 is 0, therefore, the phase error and amplitude error in the IF phase shifter of current phase shift type 6 become 0.

In the present embodiment, the current signals outputted from the Gilbert cells 1 and 2 are inputted to the IF phase shifters of current phase shift type 6 and 7. Therefore, it becomes unnecessary to convert the current signals outputted from the Gilbert cells 1 and 2 to voltage signals. To be concrete, the DC component of the current signals inputted to the LR lattice circuit included in the IF phase shifters of current phase shift type 6 and 7 flows through the indictor L, and the voltage drop across the resistor R becomes 0. Since the image rejection mixer thus operates with a low voltage, the power dissipation can be reduced.

Second Embodiment

Figure 4:
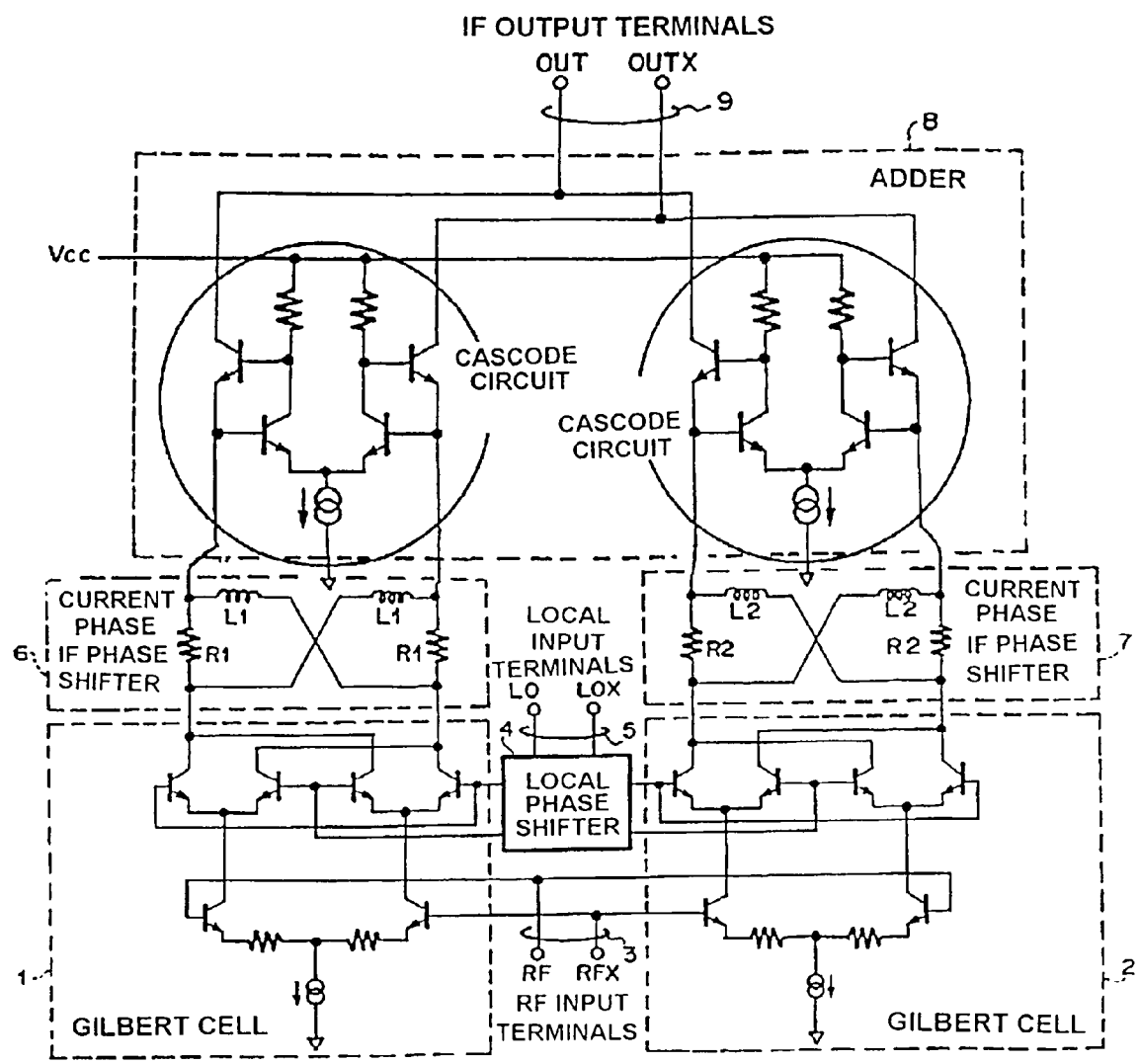
FIG. 4 is an equivalent circuit diagram of an image rejection mixer according to a second embodiment of the present invention.

FIG. 4 is an equivalent circuit diagram of an image rejection mixer of a second embodiment according to the present invention. FIG. 4 corresponds to FIG. 2 of the first embodiment. In FIG. 4, an adder 8 is different from that shown in FIG. 2. To be concrete, the adder 8 includes differential amplifiers each having a positive feedback loop designed so as not to cause signal oscillation.

As shown in FIG. 4, the adder 8 including differential amplifiers each having a positive feedback loop can be made nearly 0 in input impedance, and consequently the current gain can be made large. Furthermore, when the IF phase shifters of current phase type 6 and 7 are driven, a phase shift amplitude error actually occurs. The phase shift amplitude error can be reduced by the positive feedback loop.

Third Embodiment

Figure 5:
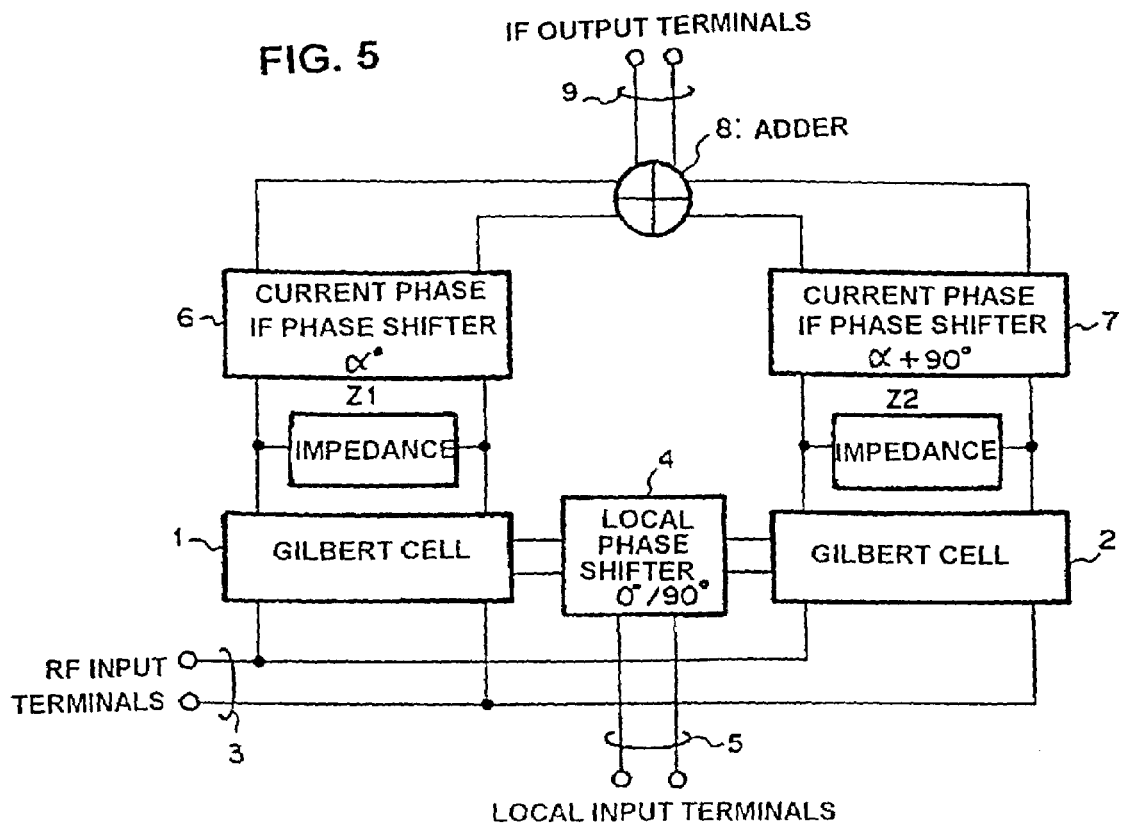
FIG. 5 is a block diagram of an image rejection mixer according to a third embodiment of the present invention.
Figure 6:
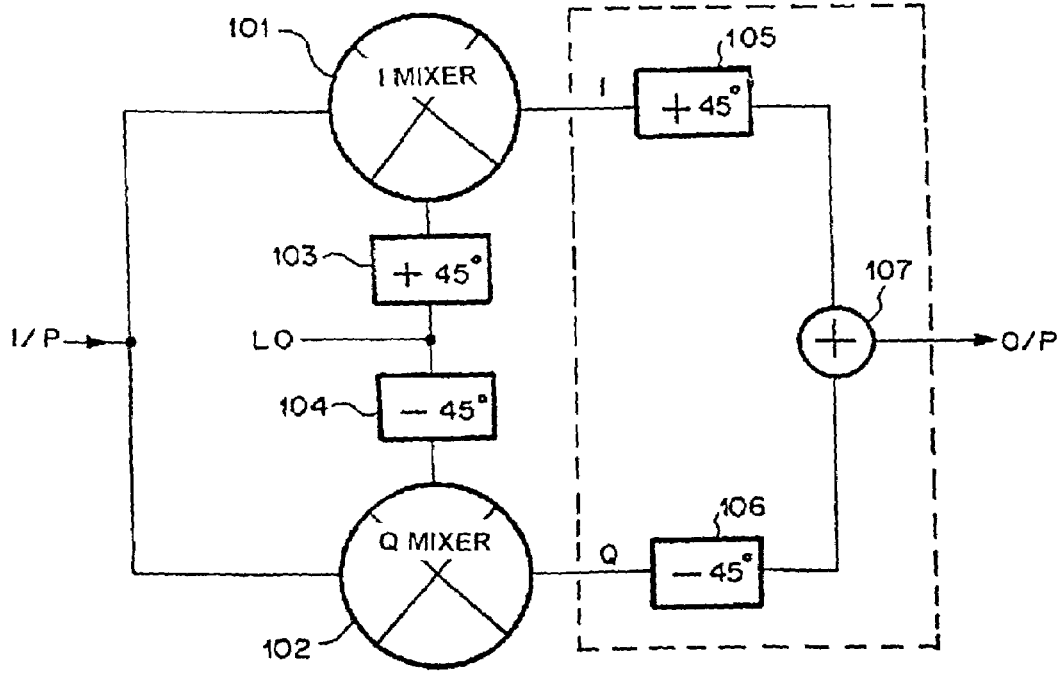
FIG. 6 is a block diagram of an image rejection mixer device of a conventional technique.
Figure 7:
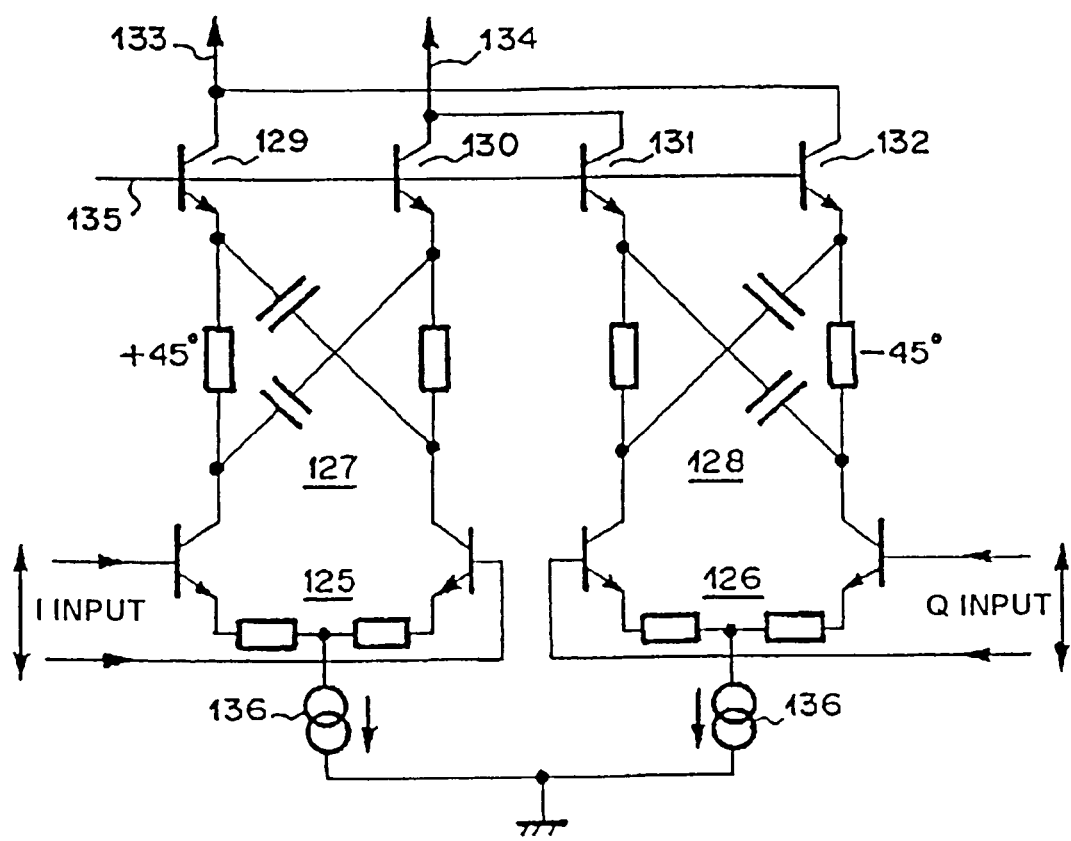
FIG. 7 is an equivalent circuit diagram of phase shifters of an image rejection mixer device shown in FIG. 6.

FIG. 5 is a block diagram of an image rejection mixer of a third embodiment according to the present invention. FIG. 5 corresponds to FIG. 1 of the first embodiment. In FIG. 5, impedances Z1 and Z2 each including, for example, a resistor, a capacitor, and an inductor, or an arbitrary combination of them are provided between the Gilbert cells 1 and 2 and the IF phase shifters of current phase type 6 and 7 in order to reduce the phase error in the Gilbert cells 1 and 2.

In the IF phase shifters of current phase type 6 and 7, the input signals are shifted in phase by α degrees and (α+90) degrees, respectively. Therefore, the values of the inductors L1 and L2 and the resistors R1 and R2 are different. Therefore, the LR lattice circuits respectively included in the IF phase shifters of current phase type 6 and 7 are different in impedance. By the influence of the parasitic effect, therefore, phase errors occur in the Gilbert cells 1 and 2.

By providing the impedances Z1 and Z2 determined on the basis of the phase differences of the IF current signals outputted from the Gilbert cells 1 and 2, the load impedances of the Gilbert cells 1 and 2 are adjusted to reduce the phase errors in the Gilbert cells 1 and 2.

The image rejection mixers of the embodiments according to the present invention heretofore described can be applied to receivers such as portable telephones and radio communication devices. To be concrete, a receiver is equipped with an image rejection mixer described in any of the embodiments and receiving means such as an antenna for receiving each RF signal. From the RF signal received by the receiving means, the image signal is removed by the image rejection mixer.

What is claimed is:

1. An image rejection mixer which comprises:
    local input terminals supplied with local signals having a phase difference in order to distribute said local signals;
    a first and a second signal mixer for mixing the distributed local signals and RF signals having phases different from those of said distributed local signals and for outputting respective IF current signals;
    a first and a second phase shifter for generating a 90 degree phase difference between said respective IF current signals; and
    a signal adder for adding the phase shifted respective IF current signals,
    wherein image signals are removed from said respective RF signals, and
    wherein said first and said second phase shifters comprise a lattice circuit consisting of inductors and resistors.

2. The image rejection mixer according to claim 1, wherein said signal adder comprises a feedback loop, and adds said IF current signals.

3. The image rejection mixer according to claim 1, wherein said feedback loop is a feedback loop of positive feedback.

4. The image rejection mixer according to claim 1, wherein said signal adder comprises a differential amplifier.

5. The image rejection mixer according to claim 1, which further comprises:
   a first impedance between said first signal mixer and said first phase shifter; and
   a second impedance between said second signal mixer and said second phase shifter.

6. The image rejection mixer according to claim 5, wherein said impedances comprises a resistor, a capacitor, or an inductor or an arbitrary combination of them.

7. The image rejection mixer according to claim 6, wherein values of said impedances are determined on the basis of a phase difference between said IF current signal outputted from said first signal mixer and said IF current signal outputted from said second signal mixer.

8. An image rejection mixer, comprising:
   local input terminals which outputs LO signals having a phase difference;
   a first and a second gilbert cell mixer, each gilbert cell mixer including:
      a current source;
      a pair of transistors, each transistor having a collector, base and emitter in which each emitter is connected to said current source through a resistor; and
      two pairs of transistors having collectors, bases and emitters, in which two coupled emitters of each pair of said two pairs of transistors are connected to each collector of said pair of transistors, one of the collectors of one transistor in one pair of said two pairs of transistors is connected to one of the collectors of one transistor in the other pair of said two pairs of transistors, balanced RF signals are input into each base of each transistor of said pair of transistors, phase differenced balanced LO signals are input to the base of each transistor of each of said two pairs of transistors, and balanced IF current signals are output from each collector of each transistor of said two pairs of transistors;
   a first and a second phase shifter including an LR lattice circuit in which said balanced IF current signals are input and phase shifted balanced IF current signals are output; and
   a signal adder including two pairs of cascode transistors having collectors, bases and emitters in which each collector of one pair of cascode transistors is connected to the collectors of another pair of cascode transistors, and each of the emitters in each transistor of each pair of cascode transistors is connected to said first and second phase shifter.

9. An image rejection mixer, comprising:
   local input terminals for outputting LO signals having a phase difference;
   a first and a second gilbert cell mixer, each gilbert cell mixer including:
      a current source;
         a pair of transistors, each transistor having a collector, base and emitter in which each emitter is connected to said current source through a resistor; and
      two pairs of transistors having collectors, bases and emitters, in which two pairs of transistors, balanced RF signals are input into each base of each transistor of said pair of transistors, phase differenced balanced LO signals are input to the base of each transistor of each of said two pairs of transistors, and balanced IF current signals are output from each collector of each transistor of said two pairs of transistors;
   a first and a second phase shifter including a LR lattice circuit in which said balanced IF current signals are input and phase shifted balanced IF current signals are output; and
   a signal adder including:
      cascode transistors having collectors, bases and emitters;
      a differential amplifier comprising:
         a current source; and
         a differential pair of transistors having collectors, bases and emitters, said emitters being coupled, and each base of each transistor of said differential pair of transistors is connected to said first and said second phase shifters, said coupled emitters of said differential pair of transistors are connected to said current source, and each collector of each transistor of said differential pair of transistors is connected to the bases of said cascode transistors; and
      resistors located between the collectors of the differential pair of transistors and a voltage source.

10. A receiver including an image rejection mixer which comprises:
   local input terminals for receiving RF frequency signals having a phase difference; and
   an image rejection mixer including:
   a signal distributor supplied with local signals having a phase difference in order to distribute said local signals;
   a first and a second signal mixer for mixing the distributed local signals and said RF signals having phases different from those of said distributed local signals and for outputting respective IF current signals;
   a first and a second phase shifter for generating a 90 degree phase difference between said respective IF current signals; and
   a signal adder for adding the phase shifted respective IF current signals,
   wherein image signals are removed by said image rejection mixer from said respective RF signals received by said signal receiver, and
   wherein said first and said second phase shifters comprise a lattice circuit consisting of having inductors and resistors.

* * * * *

UNITED STATES PATENT AND TRADEMARK OFFICE
CERTIFICATE OF CORRECTION

PATENT NO. : 6,999,746 B2 Page 1 of 1
APPLICATION NO. : 09/821002
DATED : February 14, 2006
INVENTOR(S) : Wang It is certified that error appears in the above-identified patent and that said Letters Patent is hereby corrected as shown below:

Claim 10, Column 8, Line 55, delete the word -- having --.

Signed and Sealed this

Twenty-ninth Day of August, 2006

JON W. DUDAS
*Director of the United States Patent and Trademark Office*